(12) United States Patent
Roy

(10) Patent No.: US 6,356,503 B1
(45) Date of Patent: Mar. 12, 2002

(54) REDUCED LATENCY ROW SELECTION CIRCUIT AND METHOD

(75) Inventor: Richard Roy, Danville, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 09/510,692

(22) Filed: Feb. 23, 2000

(51) Int. Cl.[7] ............................................... G11C 8/00
(52) U.S. Cl. ............... 365/230.06; 365/149; 365/154; 365/185.2; 365/185.23; 365/189.07
(58) Field of Search .................... 365/230.06, 200, 365/210, 185.2, 185.23, 154, 189.01, 230.01, 185.01, 149, 189.07

(56) References Cited

U.S. PATENT DOCUMENTS

| | | | | |
|---|---|---|---|---|
| 4,989,182 A | * | 1/1991 | Mochizuki | 365/210 |
| 5,475,640 A | * | 12/1995 | Kersh, III et al. | 365/200 |
| 5,694,369 A | * | 12/1997 | Abe | 365/210 |
| 5,793,698 A | * | 8/1998 | Koarek et al. | 365/230.08 |
| 5,926,430 A | * | 7/1999 | Noda et al. | 365/226 |
| 5,959,906 A | * | 9/1999 | Song et al. | 365/200 |
| 5,970,001 A | * | 10/1999 | Noda et al. | 365/200 |

* cited by examiner

Primary Examiner—Hoai V. Ho
(74) Attorney, Agent, or Firm—Smith, Danamraj & Youst, P.C.

(57) ABSTRACT

A reduced latency row selection circuit and method for selecting a wordline in a memory instance. Capacitance associated with row select path is de-coupled from capacitance associated with row de-select path such that both forward path delay and de-selection path delay may be optimized independently. Clock-to-wordline latency is reduced by a rapid six-stage structure that may be implemented using various logic gates. A row pre-decoder portion generates a decoded wordline clock (DXC) signal based on a row decode select clock (XC) signal and a portion of pre-decoded row address signals. The DXC signal is used by a row decoder portion for generating a wordline select (XWL) signal based on another portion of the address signals. Circuitry is provided for releasing the selected wordline in the memory upon receiving a wordline shutdown clock signal generated responsive to signals provided by dummy wordline and dummy read bitline structures disposed in the memory.

20 Claims, 6 Drawing Sheets

REDUCED LATENCY ROW SELECTION CIRCUIT AND METHOD

BACKGROUND OF THE INVENTION

1. Technical Field of the Invention

The present invention relates generally to semiconductor memories, and more particularly, to memory compilers for semiconductor memories having a circuit for reducing clock-to-wordline time delay.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that performance parameters such as access time, overall memory cycle time, etc. play a pivotal role in designing a memory circuit, whether provided in an embedded SOC application or as a stand-alone device. For high speed memories, the time between the initiation of the random access (signified by the leading edge of the clock signal in synchronous memories) and the selection of the wordline (i.e., the access port of the storage bit cell, e.g., a Static Random Access Memory (SRAM) cell) is part of the critical path of the overall access time (i.e., latency). Clearly, for minimum latency, the delay of this path must be reduced as much as possible.

Further, in several applications, the memory cycle time—typically defined as the reciprocal of time rate at which address signals are changed while reading or writing at random memory cells—needs to be minimized also. That is, the de-selection of the wordline must also be relatively fast, as the pre-charge operation of the bitlines at the end of the cycle cannot happen until the wordline has been de-selected. Otherwise, the pre-charge operation has to contend with the charged condition of the wordline (and the memory cells selected by the wordline) and, accordingly, bitline equalization will be negatively impacted.

It should be apparent to those skilled in the art that the dual requirement of fast selection and fast de-selection phases of the cycle time typically compromises the performance of both in the current memory circuit designs. Because the typical row decoder structures in the prior art use the same gate circuitry (e.g., standard NAND or NOR gates) for both selection and de-selection, the gate capacitances of the paths are coupled. Accordingly, if attempts are made to reduce the gate capacitance of the de-selection path (so as to increase the forward path speed) by reducing the size of the de-selection transistors, the de-selection path slows down, thereby adding to the overall cycle time.

SUMMARY OF THE INVENTION

Accordingly, the present invention advantageously provides a reduced latency row (i.e., wordline) selection scheme, preferably for use with high speed memory compilers, whereby the select and de-select paths in the row decoder are de-coupled such that each path may be individually optimized. In one aspect, the present invention is directed to a wordline selection circuit for selecting a wordline in a memory array based on a plurality of row address signals. The circuit comprises a row pre-decoder circuit portion to generate a decoded wordline clock (DXC) signal from a row decode select clock (XC) signal in response to the plurality of row address signals. A row decoder circuit portion is included to generate a wordline select (XWL) signal in response to the DXC signal and the row address signals. A dummy wordline (DWL) signal generator produces a DWL signal in response to the DXC signal, wherein a dummy read/write memory cell (which mimics the memory cell current) is selected by driving a dummy wordline with a dummy row decoder. A dummy read bitline (DBL) signal generator produces a DBL signal in response to the DWL signal. A wordline shutdown clock (SDB) signal generator produces an SDB signal in response to the DBL signal. Responsive to the DBL signal, the row pre-decoder circuit portion de-activates the DXC signal, preferably at the same time as or prior to the activation of the SDB signal. In addition, responsive to the SDB signal, the row decoder circuit portion de-activates the XWL signal, thereby de-selecting the wordline.

In another aspect, the present invention is directed to a memory compiler for use with designing an integrated semiconductor device having an embedded high-speed memory instance. The memory compiler comprises a memory macro cell associated with the embedded memory instance, which includes an array or core disposed with dummy wordlines, dummy read/write memory cells, dummy read/write bitlines, and a dummy row decoder driving the dummy wordlines. Circuitry is provided for driving a wordline select signal HIGH to select a wordline in the memory array core responsive to a clock signal and a plurality of row address signals. Circuitry for driving the wordline select signal LOW (thereby de-selecting the wordline) is included, which operates based on a shutdown clock signal generated in response to a dummy read bitline signal. The gate logic of the circuitry for de-selecting the wordline is de-coupled from the gate logic of the circuitry for selecting the wordline.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
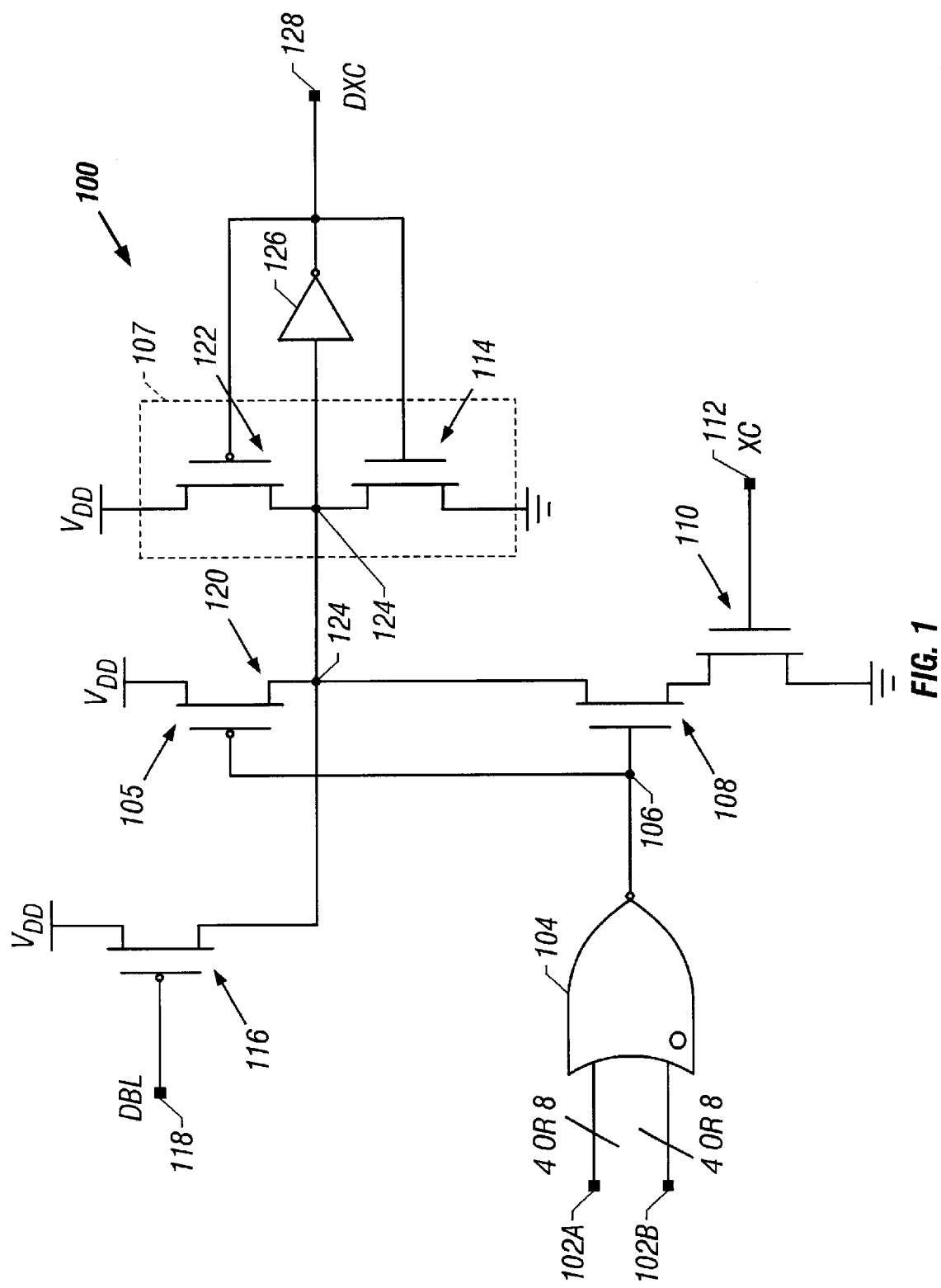
FIG. 1 depicts a simplified row pre-decoder circuit portion in accordance with the teachings of the present invention for providing a decoded wordline clock (DXC) signal.

In the drawings, like or similar elements are designated with identical reference numerals throughout the several views thereof, and the various elements depicted are not necessarily drawn to scale. Referring now to FIG. 1, depicted therein is a simplified row pre-decoder circuit portion 100 in accordance with the teachings of the present invention for providing a decoded wordline clock (DXC) signal 128 responsive to a row decode select clock (XC) signal 112. A clock signal (not shown in this FIG.) used for the overall synchronization of the wordline selection/de-selection process provides a base signal from which the XC signal 112 is derived. Those skilled in the art should realize that this clock signal may typically be provided as the master clock for the embedded memory instance which may or may not operate as the master clock for the entire chip (having the memory instance embedded therein). A NOR gate 104 receives a plurality of pre-decoded row address signals, e.g., signal groups 102A and 102B, for driving a node 106 HIGH when a particular signal combination is applied to the NOR gate 104.

Node 106 is provided as one of the inputs to a NAND gate portion 105 comprising two PMOS transistors 116, 120 and two NMOS transistors 108, 110. Those skilled in the art should readily appreciate that whereas node 106 operates as one of the input nodes driven by the NOR gate 104, a second input node of the NAND gate 105 is "split" between the XC signal node 112 that drives the NMOS transistor 110 and a dummy read bit line (DBL) signal node 118 that drives the PMOS transistor 116. Accordingly, when both DBL and XC signals are HIGH and node 106 is also driven HIGH for a particular combination of the pre-decoded row address signal combination, the output 124 of the NAND gate is driven LOW. As will be described in greater detail hereinbelow, the de-coupling of the row select and de-select paths is effectuated in accordance with the teachings of the present invention, at least in part, by driving the separate signals on the "divided" or "de-coupled" second input node of the NAND gate 105.

Continuing to refer to FIG. 1, the output of the NAND gate 105 (i.e., node 124) drives an inverter 126 such that when the XC signal is asserted and node 106 is driven HIGH, the DXC signal 128—which is produced as the output of the inverter 126—is also driven HIGH. Further, in accordance with a presently preferred exemplary embodiment of the present invention, the output of the inverter 126 is provided to a high impedance, feedback inverter portion 107 disposed between the output node 128 of inverter 126 and the output node 124 of the NAND gate 105. As can be appreciated by those skilled in the art, without the feedback inverter portion 107, if the XC signal goes LOW before the DBL signal, the output 124 may be floating which can affect the logic integrity of the DXC signal 128.

Figure 2:
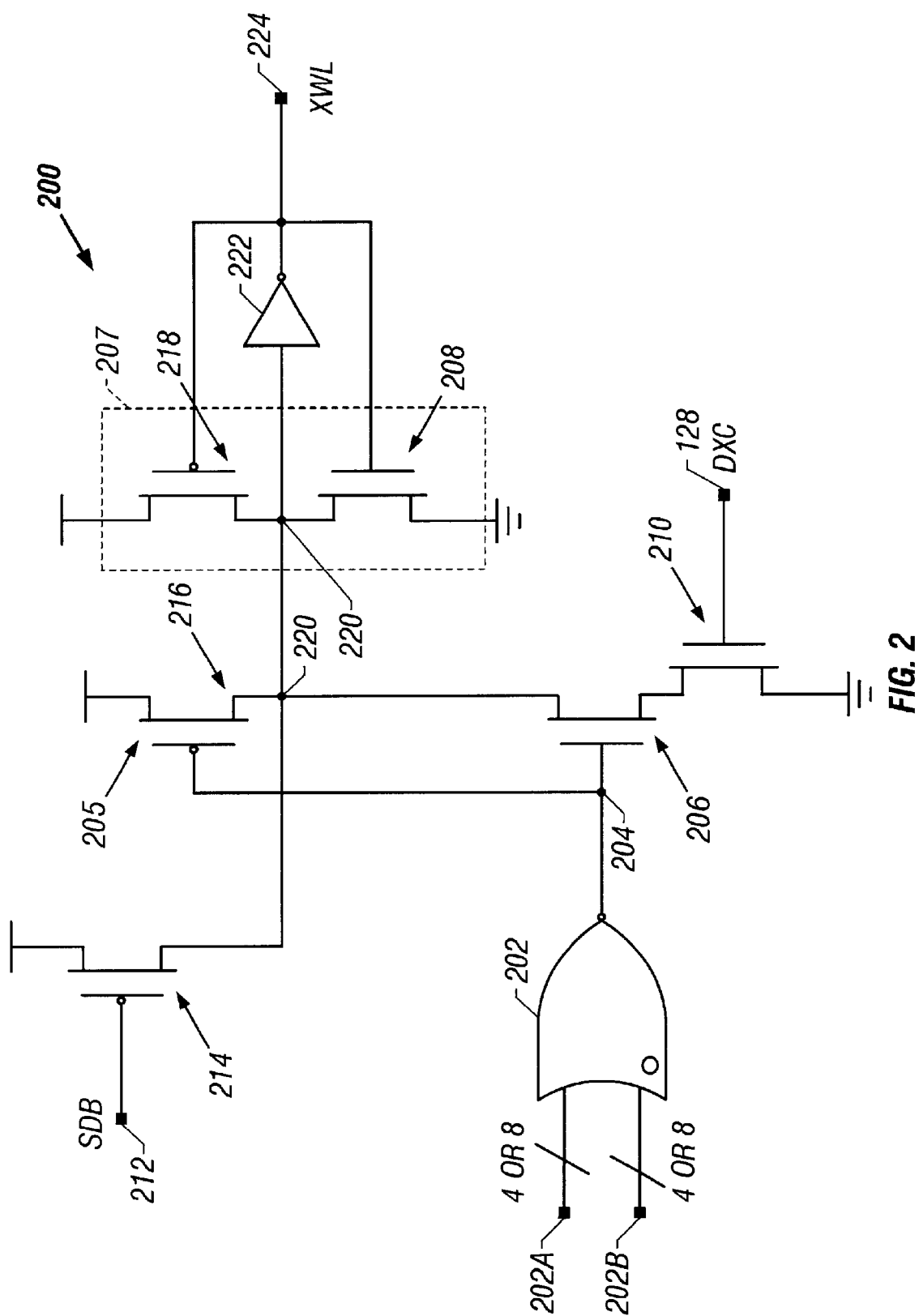
FIG. 2 depicts a simplified row decoder circuit portion for selecting a wordline using the DXC signal obtained from the circuit depicted in FIG. 1.

FIG. 2 depicts a simplified row decoder circuit portion 200 for selecting a wordline using the DXC signal 128 obtained from the circuit portion described hereinabove. Those skilled in the art should readily appreciate that the circuit portion depicted in this FIG. is very similar to the row pre-decoder circuit portion 100 of FIG. 1. A NOR gate 202 preferably receives the pre-decoded row address signals in groups 202A and 202B such that for a particular signal combination, node 204 is pulled HIGH. Again, node 204 is provided as one of the inputs to a NAND gate portion 205 comprising two PMOS transistors 214, 216 and two NMOS transistors 206, 210. Analogous to the pre-decode circuit portion shown in FIG. 1., the other input node to the NAND gate portion 205 is also split between two separate signal nodes: (i) the DXC signal node 128 driving the NMOS transistor 210; and (ii) a row shutdown clock (SDB) signal 212 which drives the PMOS transistor 214. A high impedance, feedback inverter portion 207 comprising a PMOS transistor 218 and an NMOS transistor 208 is provided herein for reducing the floating node effects with respect to the node 220 when the DXC signal 128 goes LOW before the SDB signal 212. An inverter 222, whose output is provided as an input to the feedback inverter portion 207, is used for selecting a wordline by producing a wordline select (XWL) signal 224 when its input (i.e., output node 220) is driven LOW on account of a particular signal combination appearing at the inputs of the NOR gate 202 and the DXC signal 128 being driven HIGH.

Figure 3A:
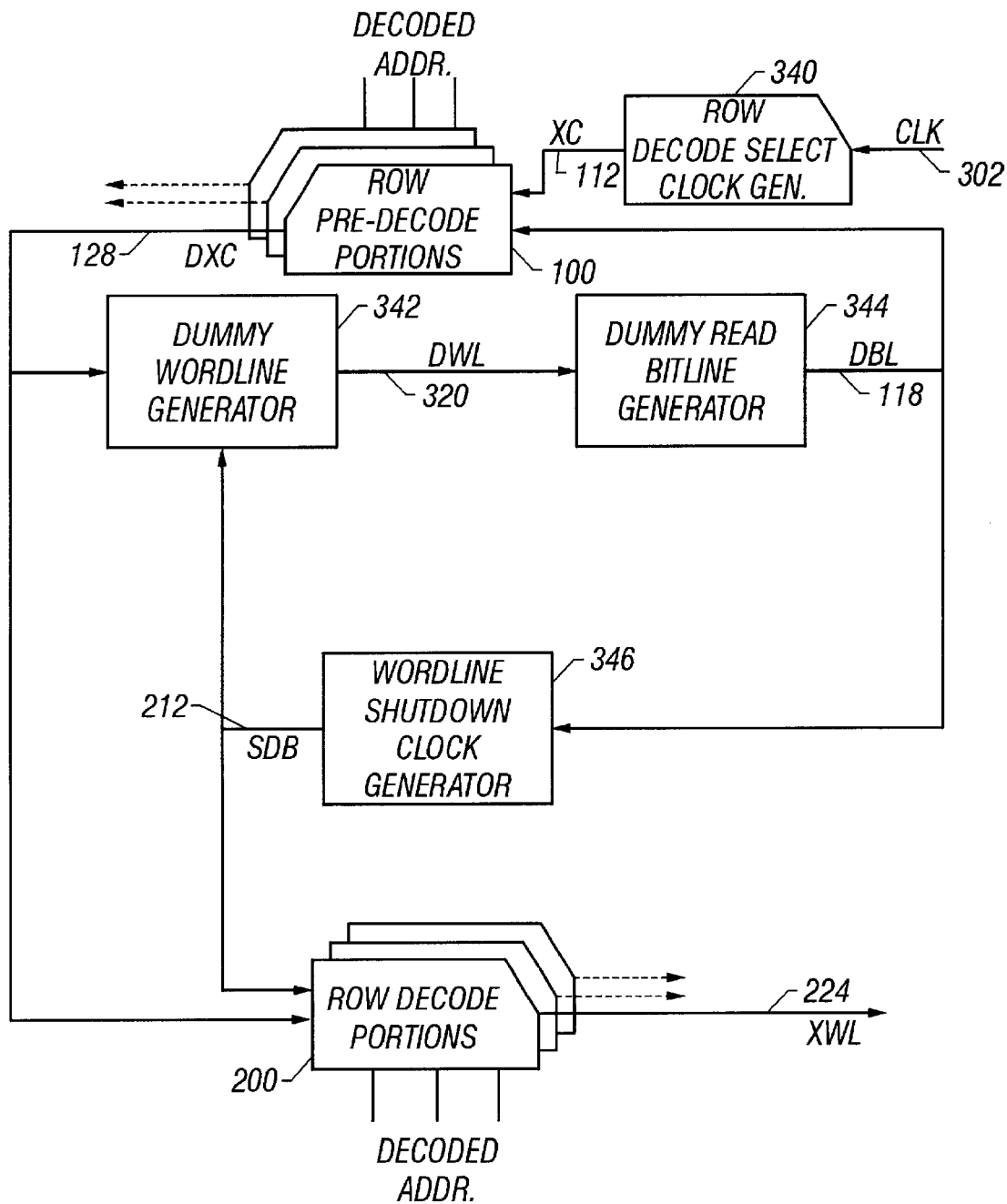
FIG. 3A depicts a functional block diagram of the circuitry for generating the various signals used in the wordline selection/de-selection process of the present invention.
Figure 3B:
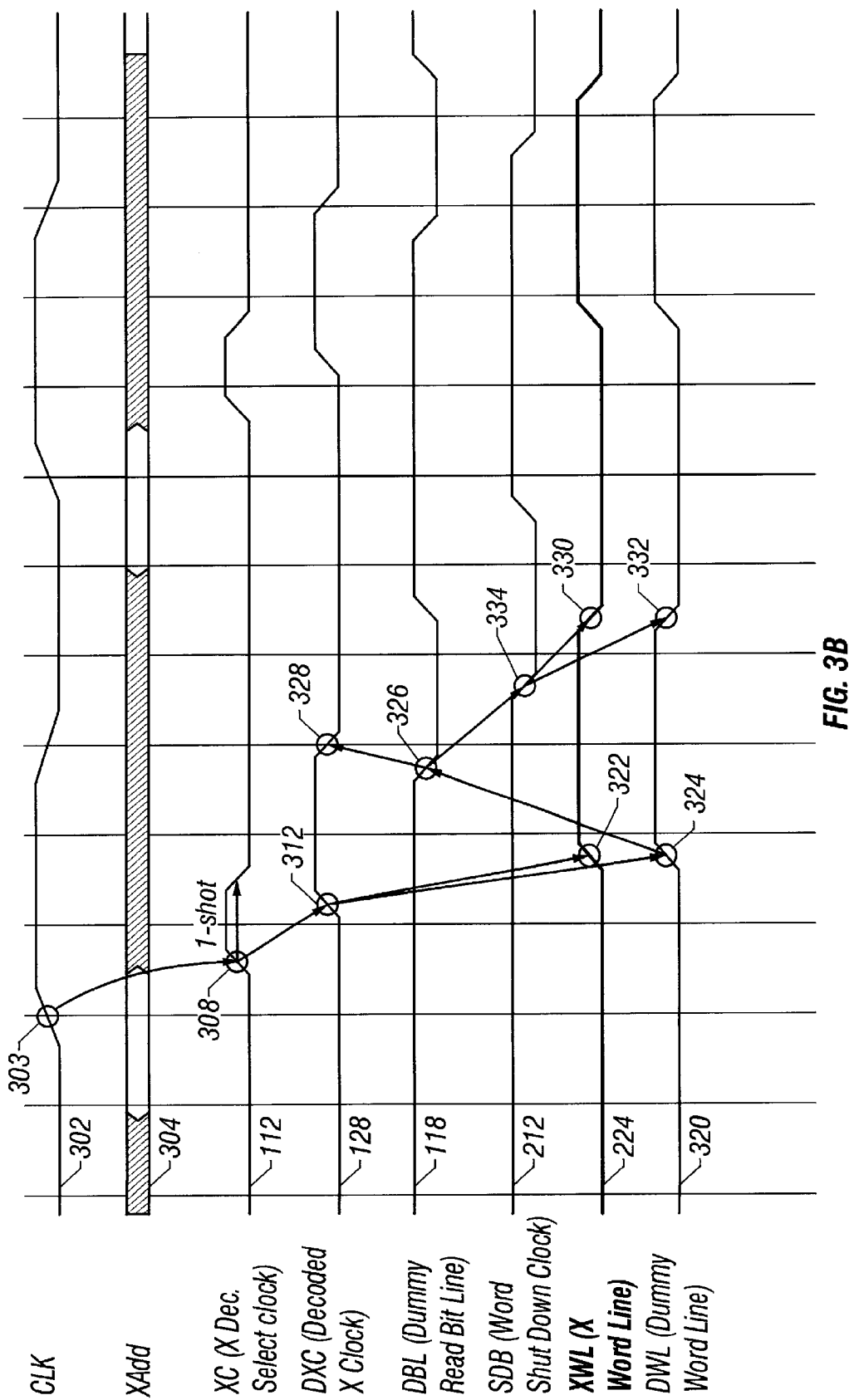
FIG. 3B is a timing diagram which depicts timing relationships among the various signals used in the wordline selection/de-selection process of the present invention.

The general operation of the de-coupled wordline selection and de-selection process of the present invention may now be described by taking FIGS. 3A and 3B together, in conjunction with the row decode and pre-decode circuit portions set forth in the foregoing, wherein FIG. 3A depicts a functional block diagram of the circuitry for generating the various signals used in the wordline selection/de-selection process of the present invention and FIG. 3B is a timing diagram which depicts timing relationships of the signals.

A row decode select clock generator 340 is used for deriving the XC signal 112 from a CLK signal 302 which, as mentioned hereinabove, may preferably operate as a master clock for the memory instance embodying the circuitry of the present invention. The row pre-decode circuit portion 100 receives the XC signal 112 and generates the DXC signal 128 based on a particular row address signal combination provided thereto. As can be seen, the circuit portion 100 is illustrative of one of a plurality of row pre-decode circuits necessary to drive the plurality of row decode circuit portions, e.g., row decode circuit 200. The DXC signal 128 and the rest of row address signals are then used by the exemplary row decode circuit portion 200 for selecting a particular wordline by driving the XWL signal 224 associated therewith HIGH. It should be apparent to those skilled in the art that the row decode circuit 200 is illustrative of one of a plurality of such circuits which correspond to the number of rows or wordlines in a memory instance.

The DXC signal 128 is also provided to a dummy wordline (DWL) signal generator 342 which produces a DWL signal 320. A dummy wordline driver is provided as part of the DWL generator for driving a DWL structure that mimics parasitic loading of an active wordline, e.g., XWL 224. The DWL signal 320 is provided to a dummy bitline (DBL) signal generator 344 (which mimics the current flow of a memory cell) in order to produce the DBL signal 118 used in the row pre-decode circuit portion 100 for turning off the DXC signal 128. The DBL signal 118 is also provided to an SDB signal generator 346 for producing the SDB signal 212 used in the row decode circuit portion 200. Additionally, the DBL signal 118 may preferably be used elsewhere to pre-charge the bitlines. As can be seen in FIG. 2, the SDB signal 212 drives the PMOS transistor 214 of the NAND gate portion 205 to pull the input of the inverter 222 HIGH. Accordingly, the XWL signal 224 is pulled LOW thereafter, thereby de-selecting the particular wordline.

The chronological sequence of the foregoing signals is set forth in the timing diagram depicted in FIG. 3B. Upon stabilizing the row address signals 304, a rising edge 308 is generated as a 1-shot pulse in the XC signal 112 derived from clock signal 302. Responsive to the rising edge 308 in the XC signal 112, a rising edge 312 is generated in the DXC signal 128 for a particular row address. As shown in the circuit portion depicted in FIG. 1, node 106 is pulled HIGH when a particular combination of the pre-decoded row address signals are applied to the NOR gate 104. Accordingly, the output node 124 is driven LOW when the XC signal 112 turns the transistor 110 (forward or select path stage) of the NAND gate 105 ON. The DXC signal 128, as the output signal of the inverter 126 coupled to node 124, therefore, goes HIGH.

Responsive to the rising edge 312 in the DXC signal 128, a rising edge 322 is produced in the XWL signal 224 because node 204 is driven HIGH and the second input node of the NAND gate portion 205 is also HIGH (shown in FIG. 2). This rising edge 322 in the XWL signal 224 signifies the selection of a particular wordline in the memory array corresponding to the asserted row address signals 304. Thus, it should be apparent to those skilled in the art that the time delay from the CLK signal's rising edge 303 to the XWL signal's rising edge 322 is the delay associated with the wordline selection (or, forward path) portion of the cycle time of the memory designed in accordance with the teachings of the present invention. Also, it should be realized that the forward path capacitance is significantly reduced (because the gate capacitance of the de-select path is not involved). Those skilled in the art should appreciate upon reference hereto that capacitance reduction is due to the de-coupling of a reasonably large de-select SDB p-channel device 214 (which is necessary to optimize the de-select path) in each row decode portion 200. For instance, for 256 memory cells per bitline (i.e., 256 separate row decode circuit portions), the elimination of this capacitance has a huge effect on the total capacitance that must be driven in the selection path of the DXC signal 128 which drives the n-channel device 210. This huge overall capacitance reduction allows the number of stage delays between the CLK and XWL signals to be reduced to only six stages for a fully decoded structure (four stages between CLK to DXC signals and two stages between DXC and XWL signals) in a presently preferred exemplary embodiment of the present invention.

Continuing to refer to the timing diagram shown in FIG. 3B, the rising edge 312 in the DXC signal 128 also causes a rising edge 324 in the DWL signal 320. In accordance with the teachings of the present invention, the edge 324 in the DWL signal 320 initiates the wordline de-selection (i.e., shut down) process. Responsive to the edge 324 of the DWL signal 320, a falling edge 326 is created in the DBL signal 118 by the DBL signal generator 344 (shown in FIG. 3A). As provided in the row pre-decode circuit portion 100 of FIG. 1, the falling edge 326 of the DBL signal 118 turns the PMOS device 116 (de-select path stage) of the NAND gate portion 105 ON, thereby driving the node 124 HIGH. Accordingly, the DXC signal 128 is driven LOW by the inverter 126, causing the falling edge 328.

The DBL signal 118 is also provided to the SDB signal generator 346 (shown in FIG. 3A), whereby the falling edge 326 of the DBL signal 118 causes a falling edge 334 in the SDB signal 212. Preferably, the SDB signal activation takes place after driving the DXC signal LOW so as to avoid undesirable effects such as "crow bar" currents in the NAND gate portion 205. As provided in the row decode circuit portion 200 of FIG. 2, the falling edge 334 of the SDB signal 212 turns the PMOS device 214 (de-select path stage) of the NAND gate portion 205 ON, thereby driving the node 220 HIGH. Accordingly, the XWL signal 224 is driven LOW by the inverter 222, causing the falling edge 330 which de-selects the wordline of the memory. In addition, responsive to the falling edge 334 of the SDB signal 212, a falling edge 332 is created in the DWL signal 332 also.

The time delay from the edge 322 (or edge 324) to the edge 330 (or edge 332) represents the total time during which the XWL signal 224 is HIGH and, therefore, the time taken for de-selecting the wordline associated therewith. Those skilled in the art should appreciate that the present invention completely separates the gate capacitance associated with the de-select path of the row decoder from the capacitance of the select path and, accordingly, a fast de-select time is advantageously achieved independent of the requirements of the select phase of the memory cycle time.

Figure 4:
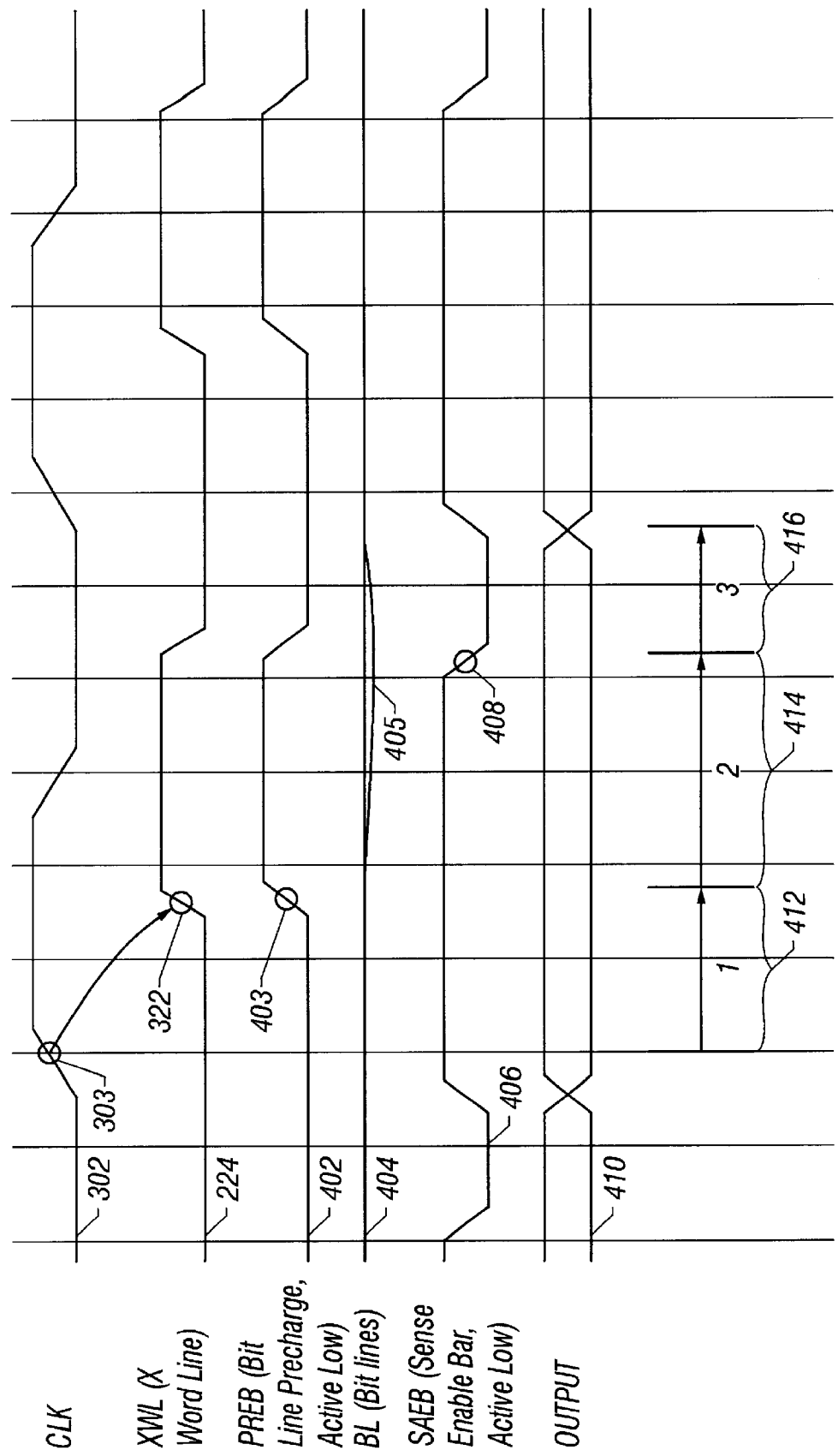
FIG. 4 is a timing diagram depicting the overall timing delay between the clock and output signals in a memory circuit designed in accordance with the teachings of the present invention.

Referring now to FIG. 4, depicted therein is a timing diagram which illustrates the overall timing delay (i.e., overall access time or latency) between the CLK 302 and output signals 410 in a memory circuit designed in accordance with the teachings of the present invention. Preferably, at the same time as selecting the wordline by pulling the associated XWL signal 224 HIGH, a bitline pre-charge (PREB) signal 402 is de-activated by creating a rising edge 403 therein. The appropriate bitlines are pulled LOW from reading the data of the memory cells, as exemplified by the falling line 405 of the overall bitline signals 404. A sense enable bar (SAEB) signal 406 is then asserted LOW by creating a falling edge 408 therein for latching the data. The stabilized data is then provided on the output lines.

Those skilled in the art should appreciate that the overall latency comprising: (i) wordline selection phase 412, (ii) generating output signals on the bitlines 414, and (iii) latching the data and driving appropriate output lines 416, is minimized advantageously by reducing the delay associated with the wordline selection phase 412 in accordance with the teachings of the present invention.

Figure 5:
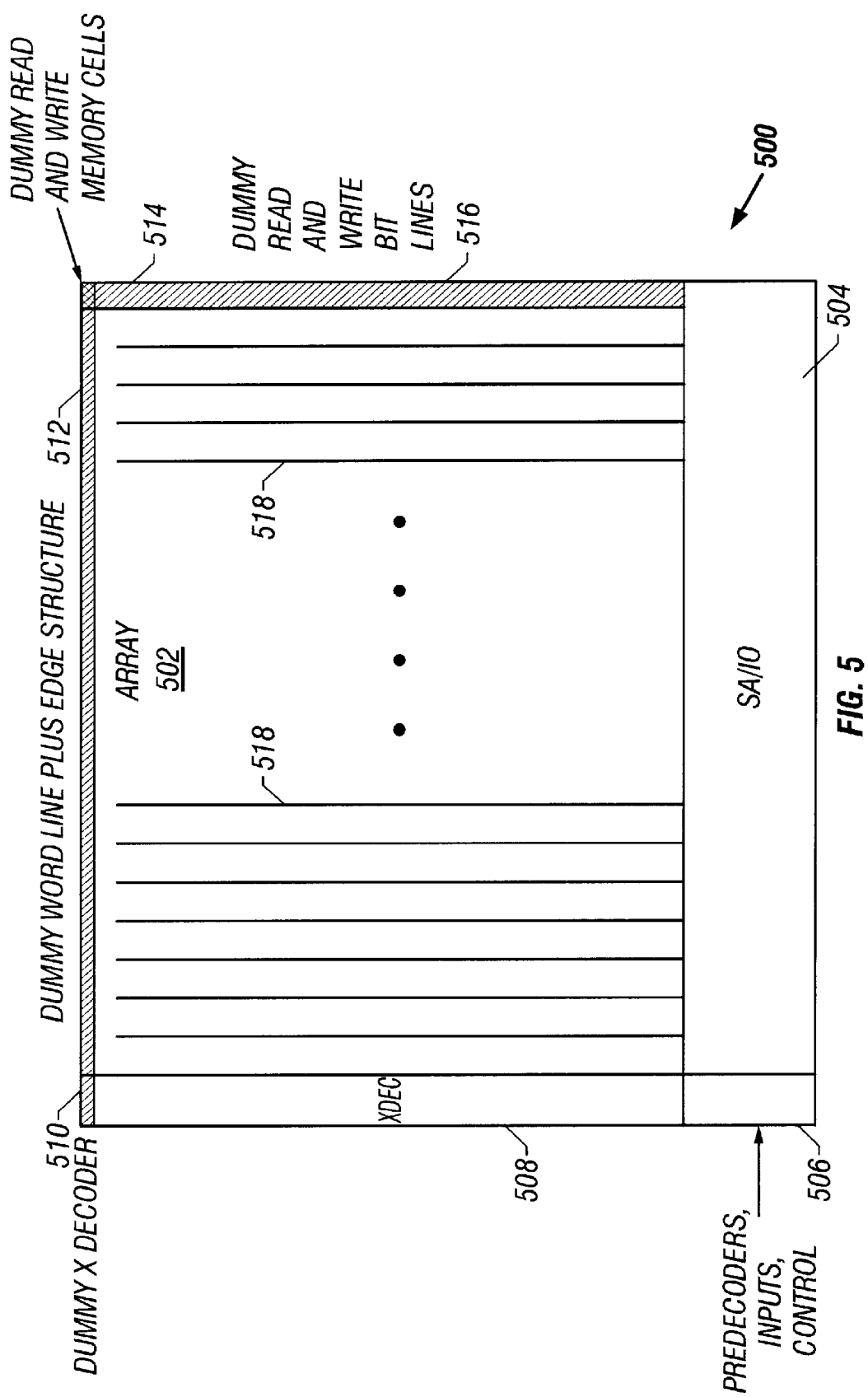
FIG. 5 is a physical architectural view of a presently preferred exemplary embodiment of a memory compiler having the row pre-decoder and decoder circuits of the present invention.

FIG. 5 is a physical architectural view of a presently preferred exemplary embodiment of a SRAM circuit 500 having the row pre-decode and decode circuits of the present invention, preferably provided as a memory compiler for design re-use and/or embedded applications. A memory array or instance 502 (having a plurality of bitlines 518 illustrated therein) is surrounded by a plurality of peripheral circuit portions in a known manner. A Sense Amplifier and Input/Output (SA/IO) portion 504 is conventionally provided with respect to the memory array 502. A peripheral portion 506 is provided with pre-decoders, inputs and control circuitry. A row decoder circuit portion 508 containing portions of the circuitry of the present invention is also disposed relative to the memory array 502.

In accordance with the teachings of the present invention, a dummy wordline decoder portion 510 is provided for generating DWL signals that select dummy wordlines and associated edge structures 512. Also, dummy read/write memory cells 514 that imitate the electrical behavior of the array memory cells are provided. Dummy read/write bitlines 516 corresponding to the dummy read/write memory cells 514 are accordingly provided as well.

It should be apparent that the DWL and DBL signals are utilized in the present invention for "coordinating" the wordline selection and de-selection processes, respectively, in accordance herewith. That is, a rising edge in the DWL signal indicates that a wordline in the memory array 502 is HIGH and, accordingly, the de-selection process may commence as early as possible. The falling edge in the DBL signal, responsive to the DWL signal, indicates that the bitlines in the memory array are driven LOW (i.e., the data is now available on the outputs) and, accordingly, the wordline may be released. Bitline pre-charging may then take place in certain preferred implementations without having to overcome the current drive of the selected memory cells from the charged state of the wordline.

Based on the foregoing, it should be appreciated that the present invention provides a fast wordline selection scheme that advantageously overcomes the deficiencies and shortcomings of the prior art by de-coupling the heavy parasitic load capacitances of the select and de-select paths such that each path may be maximized for speed without having to account for the gate capacitance of the other path. Accordingly, both selection and de-selection phases of the memory cycle time are significantly reduced. Also, the sizes of transistors used in select and de-select paths can be individually designed for optimizing the area requirements for a particular cycle time performance without compromising between the path delays associated therewith.

Additionally, it is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although the presently preferred exemplary embodiments of the present invention have been described with de-coupled NAND gate implementations, it should be realized that the wordline selection scheme of the present invention may be practiced with other logic gates, e.g., NOR structures etc. In addition, the row address inputs to the logic gates may be fully decoded, partially decoded, and the like. Furthermore, although SRAM circuits have been exemplified in the present patent application, the teachings herein are applicable to a variety of memory devices, e.g., DRAMs, non-volatile memory, Flash memory, etc. Accordingly, it should be clearly understood that these and other numerous variations, substitutions, additions, re-arrangements, extensions, and modifications are contemplated to be within the ambit of the present invention whose scope is solely limited by the claims set forth below.

What is claimed is:

1. A wordline selection circuit for selecting a wordline in a memory array based on a plurality of row address signals, said circuit comprising:
   a row pre-decoder circuit portion to generate a decoded wordline clock signal from a row decode select clock signal based on a first portion of said plurality of row address signals;
   a row decoder circuit portion to generate a wordline select signal in response to said decoded wordline clock signal and a second portion of said plurality of row address signals, said wordline select signal operating to drive a particular wordline in said memory array to a logic high state; and
   means for producing a dummy wordline signal in response to said decoded wordline clock signal.

2. The wordline selection circuit as set forth in claim 1, further comprising:
   means for producing a dummy read bitline signal in response to said dummy wordline signal; and
   means for producing a wordline shutdown clock signal in response to said dummy read bitline signal,
   wherein, responsive to said dummy read bitline signal, said row pre-decoder circuit portion de-activates said decoded wordline clock signal and, responsive to said wordline shutdown clock signal, said row decoder circuit portion de-activates said wordline select signal.

3. The wordline selection circuit as set forth in claim 2, wherein said row pre-decoder circuit portion comprises:
   a logic gate receiving said first portion of said plurality of row address signals, said logic gate for driving a node;
   a NAND gate portion with a first input coupled to said node and a second input split between two separate signal nodes driven by said dummy read bitline signal and said row decode select clock signal, respectively, said NAND gate portion having an output node;
   an inverter having an input node coupled to said output node of said NAND gate portion, said inverter further having an output driving a logic state of said decoded wordline clock signal; and
   a feedback inverter portion coupled between the outputs of said NAND gate portion and said inverter.

4. The wordline selection circuit as set forth in claim 3, wherein said logic gate comprises a NOR gate.

5. The wordline selection circuit as set forth in claim 2, wherein said row decoder circuit portion further comprises:
   a logic gate receiving said second portion of said plurality of row address signals, said logic gate for driving a node;
   a NAND gate portion with a first input coupled to said node and a second input split between two separate signal nodes driven by said wordline shutdown clock signal and said decoded wordline clock, respectively, said NAND gate portion having an output node;
   an inverter having an input node coupled to said output node of said NAND gate portion, said inverter further having an output driving a logic state of said wordline select signal; and
   a feedback inverter portion coupled between the outputs of said NAND gate portion and said inverter.

6. The wordline selection circuit as set forth in claim 5, wherein said logic gate comprises a NOR gate.

7. A reduced row latency method for selecting a wordline in a memory array based on a plurality of row address signals, comprising the steps of:
   deriving a row decode select clock signal from a clock signal, upon stabilizing said plurality of row address signals;
   generating a decoded wordline clock signal responsive to said row decode select clock signal and a first portion of said plurality of row address signals;

generating a wordline select signal to select a wordline in said memory array based on said decoded wordline clock signal and a second portion of said plurality of row address signal;

generating a dummy wordline signal in response to said decoded wordline clock signal;

responsive to said dummy wordline signal, generating a dummy read bitline signal;

responsive to said dummy read bitline signal, de-activating said decoded wordline clock signal and generating a wordline shutdown clock signal; and responsive to said wordline shutdown clock signal, de-activating said wordline select signal and said dummy wordline signal.

8. The reduced row latency method for selecting a wordline as set forth in claim 7, wherein said memory array comprises a Dynamic Random Access Memory (DRAM) instance in an embedded circuit, and wherein said wordline is selected in six gate stages between said clock signal and said wordline select signal.

9. The reduced row latency method for selecting a wordline as set forth in claim 7, wherein said memory array comprises a Static Random Access Memory (SRAM) instance in an embedded circuit, and wherein said wordline is selected in six gate stages between said clock signal and said wordline select signal.

10. The reduced row latency method for selecting a wordline as set forth in claim 7, wherein said memory array comprises an Electrically Programmable Read-Only Memory (EPROM) instance in an embedded circuit, and wherein wordline is selected in six gate stages between said clock signal and said wordline select signal.

11. The reduced row latency method for selecting a wordline as set forth in claim 7, wherein said memory array comprises a Flash EPROM instance in an embedded circuit, and wherein said wordline is selected in six gate stages between said clock signal and said wordline select signal.

12. A memory compiler for use with designing an integrated semiconductor device having an embedded memory instance, comprising:

a memory macro cell associated with said embedded memory instance, said memory macro cell including an array core surrounded by dummy wordlines, dummy read/write memory cells, dummy read/write bitlines, and a dummy row decoder driving said dummy wordlines;

selecting means for driving a wordline select signal HIGH to select a wordline in said memory array core responsive to a clock signal and a plurality of row address signals; and de-selecting means for driving said wordline select signal LOW based on a shutdown clock signal generated in response to a dummy read bitline signal which indicates that data is available on an array core bitline, wherein logic gate circuitry forming said de-selecting means is de-coupled from logic gate circuitry forming said select means.

13. The memory compiler as set forth in claim 12, wherein said dummy read bitline signal is generated responsive to a dummy wordline signal produced by said dummy wordline decoder, said dummy wordline signal for indicating that said wordline in said array core is driven HIGH.

14. The memory compiler as set forth in claim 13, wherein said integrated semiconductor device comprises a System-On-Chip (SOC) device, and further wherein said embedded memory instance comprises a DRAM circuit.

15. The memory compiler as set forth in claim 13, wherein said integrated semiconductor device comprises a System-On-Chip (SOC) device, and further wherein said embedded memory instance comprises an EPROM circuit.

16. The memory compiler as set forth in claim 13, wherein said integrated semiconductor device comprises a System-On-Chip (SOC) device, and further wherein said embedded memory instance comprises a Flash memory circuit.

17. The memory compiler as set forth in claim 13, wherein said integrated semiconductor device comprises a System-On-Chip (SOC) device, and further wherein said embedded memory instance comprises a SRAM circuit.

18. A wordline selection circuit for selecting a wordline in a memory array based on a plurality of row address signals, said circuit comprising:

a row pre-decoder circuit portion for generating a decoded wordline clock signal from a row decode select clock signal based on a first portion of said plurality of row address signals;

a row decoder circuit portion for generate a wordline select signal in response to said decoded wordline clock signal and a second portion of said plurality of row address signals, said wordline select signal operating to drive a particular wordline in said memory array to a logic high state; and circuitry for releasing said particular wordline in said memory array upon receiving a wordline shutdown clock signal generated in response to signals provided by dummy wordline and dummy read bitline structures operably disposed in said memory array.

19. The wordline selection circuit as set forth in claim 18, wherein said row pre-decoder circuit portion comprises:

a first logic gate receiving said first portion of said plurality of row address signals, said first logic gate for driving a first node;

a first NAND gate portion with a first input coupled to said first node and a second input split between two separate signal nodes driven by a dummy read bitline signal generated from said dummy read bitline structure and said row decode select clock signal, respectively, said first NAND gate portion having an output node;

a first inverter having an input node coupled to said output node of said first NAND gate portion, said first inverter further having an output driving a logic state of said decoded wordline clock signal; and a first feedback inverter portion coupled between the outputs of said first NAND gate portion and said first inverter.

20. The wordline selection circuit as set forth in claim 19, wherein said row decoder circuit portion further comprises:

a second logic gate receiving said second portion of said plurality of row address signals, said second logic gate for driving a second node;

a second NAND gate portion with a first input coupled to said second node and a second input split between two separate signal nodes driven by said wordline shutdown clock signal and said decoded wordline clock, respectively, said second NAND gate portion having an output node;

a second inverter having an input node coupled to said output node of said second NAND gate portion, said second inverter further having an output driving a logic state of said wordline select signal; and a second feedback inverter portion coupled between the outputs of said second NAND gate portion and said second inverter.

* * * * *